(12) United States Patent
Yang

(10) Patent No.: US 7,924,911 B2
(45) Date of Patent: Apr. 12, 2011

(54) TECHNIQUES FOR SIMULATING A DECISION FEEDBACK EQUALIZER CIRCUIT

(75) Inventor: Zhiping Yang, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 1540 days.

(21) Appl. No.: 11/255,477

(22) Filed: Oct. 21, 2005

(65) Prior Publication Data
US 2007/0091993 A1   Apr. 26, 2007

(51) Int. Cl.
*H03H 7/30* (2006.01)
*H03K 5/159* (2006.01)
(52) U.S. Cl. .......... 375/233; 375/234; 375/235; 375/368
(58) Field of Classification Search .................. 375/233, 375/348, 355, 232, 234; 708/323, 320
See application file for complete search history.

(56) References Cited

U.S. PATENT DOCUMENTS

| | | | |
|---|---|---|---|
| 3,648,171 A * | 3/1972 | Hirsch .......................... | 375/233 |
| 7,030,657 B2 | 4/2006 | Stojanovic et al. ............. | 326/87 |
| 2005/0238093 A1* | 10/2005 | Payne et al. .................... | 375/224 |
| 2006/0234662 A1* | 10/2006 | Diloisy ......................... | 455/273 |
| 2007/0091992 A1* | 4/2007 | Dowling ....................... | 375/229 |
| 2007/0195874 A1* | 8/2007 | Aziz et al. ..................... | 375/233 |
| 2008/0101510 A1* | 5/2008 | Agazzi ......................... | 375/346 |

OTHER PUBLICATIONS

"SerDes," http://searchstorage.techtarget.com/gDefinition/0,294236,sid5_gci1006456,00.html; accessed Sep. 26, 2005.
Wagner, B., et al., "Introduction to Digital Filters," http://www.netrino.com/Publications/Glossary/Filters.html, accessed Sep. 26, 2005.
"Fractionally Spaced Equalizers," http://www.mathworks.com/access/helpdesk/help/toolbox/comm/a1049736274.html; accessed Oct. 16, 2005.
"Symbol-Spaced Equalizers," http://www.mathworks.com/access/helpdesk/help/toolbox/comm/a1049736245.html, accessed Oct. 16, 2005.
"Decision-Feedback Equalizers," http://www.mathworks.com/access/helpdesk/help/toolbox/comm/a1049736296b1.html, accessed Oct. 16, 2005.

* cited by examiner

*Primary Examiner* — Chieh M Fan
*Assistant Examiner* — Qutbuddin Ghulamali
(74) *Attorney, Agent, or Firm* — BainwoodHuang

(57) ABSTRACT

A computerized system simulates a non-linear Decision Feedback Equalizer. The computerized system includes a user interface, an output port, and a controller coupled to the user interface and to the output port. The controller is configured to (i) receive electronic design automation commands from a user through the user interface, (ii) generate, as an electronic model of the non-linear Decision Feedback Equalizer, an electronic representation of a linear filter in response to the electronic design automation commands, and (iii) integrate the electronic representation of the linear filter into an electronic circuit design having other electronic representations of other electronic circuits. The electronic circuit design is externally accessible through the output port.

19 Claims, 4 Drawing Sheets

TECHNIQUES FOR SIMULATING A DECISION FEEDBACK EQUALIZER CIRCUIT

BACKGROUND

SERializer/DESerializer (SERDES) devices are integrated circuit (IC) transceivers that convert parallel data streams to serial data streams and vice-versa. Such devices are often used in high speed communications circuits such as Gigabit Ethernet systems, wireless network routers, fiber optic communications systems and storage applications. Some SERDES devices are capable of operating at speeds in excess of 10 Gigabits per second (Gbps).

Each SERDES transceiver typically includes (i) a transmitter portion having a parallel-to-serial converter to convert parallel data into serial data, and (ii) a receiver portion having a serial-to-parallel converter to convert serial data into parallel data. This configuration enables SERDES transceivers to convey parallel data between two points over serial streams and thus reduce the number of data paths, the number of connecting pins and the number of wires involved in the transfer.

The receiver portions of SERDES transceivers include time-dispersive channels that are susceptible to intersymbol interference (ISI). To boost the signal-to-noise ratio and the bit-error-rate (BER) of the receiver portions, manufacturers typically include Decision Feedback Equalizers (DFEs) in the receiver portions of the SERDES transceivers.

FIG. 1 shows a conventional DFE 20 which is capable of being used in high-speed SERDES technology. As shown, the DFE 20 is a nonlinear equalizer having a signal pathway 22 and a feedback filter 24. The signal pathway 22 follows a pre-emphasis stage 26 and a channel 28, and resides on the receiver side of a larger electronic circuit. The signal pathway 22 includes summation circuitry 30 and a sampler (or output) 32 which are serially connected. The feedback filter 24 includes a tapped delay line 34 formed by series-connected delay segments (or circuits) $34(2), \ldots 34(n)$ and associated weight circuits $36(1), 36(2), \ldots 36(n)$ (collectively, weight circuits 36). The non-linearity of the DFE 20 should be clear in FIG. 1 since the output of the sampler block 32 is required as input in a feedback loop manner through the feedback filter 24 and the summation circuit 30.

During operation, the signal pathway 22 of the DFE 20 receives an input signal 38 from the channel 28 and provides an output signal 40. The delay line 34 of the feedback filter 24 receives the output signal 40 from the sampler 32 and provides a set of delayed signals $42(1), 42(2), \ldots 42(n)$ (collectively, delayed signals 42) to the associated weight circuits 36 in a feedback loop manner. Typically, the delay segments $34(2), \ldots 34(n)$ are 1-bit timer delay circuits that provide 1-bit delays to the output signal 40. The weight circuits 36 then provide a set of weighted signals $44(1), 44(2), \ldots 44(n)$ (collectively, weighted signals 44) to the summation circuitry 30 of the signal pathway 22 in response to (i) the set of delayed signals 42 and (ii) a set of decisions 46 (e.g., training from a controller).

It should be understood that the decisions 46 (i.e., a specific decision 46 for each weight circuit 36) enable the signal pathway 22 of the DFE 20 to output, as the output signal 40, a weighted sum of the values of the input signal 38 and the weighted signals 44. Such feedback-loop operation enables the DFE 20 to cancel the intersymbol interference while minimizing noise enhancement which is a typical deficiency of conventional linear equalizers.

It should be further understood that conventional Electronic Design Automation (EDA) tools are capable of modeling DFE circuits. For example, the following is a pseudo-code model for a DFE which is similar to the DFE 20 of FIG. 1.

1. Initialize all state variables
2. Input bits convolute with channel and pre-emphasis function:
   temp1 = input © pre-emphasis © Channel
3. For i = 1 : length of temp1
   temp2(i) = temp1(i) + FIR_filter(output(1:i−1))
   output(i) = Sampler(temp2(i))
4. End for loop In this pseudo-code model, the current bit value (e.g., temp 2) is a based on a previous bit value. That is, the signal from the channel into the summation circuit (e.g., see the signal 47 in FIG. 1) corresponds to temp 1, and the signal from the summation circuit entering the sampler block (e.g., see the signal 48 in FIG. 1) corresponds to temp 2. The symbol © in the above-provided pseudo-code represents a convolution operation.

SUMMARY

Unfortunately, there are deficiencies to the above-described conventional DFE model when used in an Electronic Design Automation process. In particular, the conventional DFE model is a nonlinear function, and thus cannot be effectively simulated by a traditional linear simulation (e.g., a typical EDA tool). That is, there is significant inefficiency caused by the nonlinear sampler block 32 (also see FIG. 1) because its input is based on its previous output. As a result, the DFE model cannot be well integrated with a linear circuit simulator. In fact, the DFE model cannot even be liberalized and approximated by a linear block. Rather, for every bit/step of simulation, the simulator has to use a nonlinear function to determine the previous bit values in order to feed this information forward into the next simulation step. Accordingly, advantages of a linear system (e.g., matrix and FFT simulation operations) cannot be directly applied. Thus, the simulation speed of designs using the DFE model (e.g., SERDES circuit simulation) is extremely slow and current EDA tools often cannot handle use of such a DFE model.

In contrast to the conventional approach of modeling a DFE in an EDA tool in a nonlinear manner, embodiments of the invention are directed to techniques for simulating a non-linear DFE as a linear filter which can be exclusive of nonlinear operations. For example, the non-linear DFE 20 (FIG. 1) is capable of being represented as a simple finite impulse response (FIR) linear filter which can be effectively simulated by standard EDA tools. Such a representation is acceptable since simulation can safely assume that a sampler within the filter is always the correct decision. As a result, complete channel performance (e.g., of a SERDES device) can be easily evaluated in time-domain space, frequency-domain space, and parameter space.

One embodiment is directed to a computerized system to simulate a non-linear Decision Feedback Equalizer. The computerized system includes a user interface, an output port, and a controller coupled to the user interface and to the output port. The controller is configured to (i) receive electronic design automation commands from a user through the user interface, (ii) generate, as an electronic model of the non-linear Decision Feedback Equalizer, an electronic representation of a linear filter in response to the electronic design automation commands, and (iii) integrate the electronic representation of the linear filter into an electronic circuit design having other electronic representations of other electronic circuits. The electronic circuit design is externally accessible through the output port.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
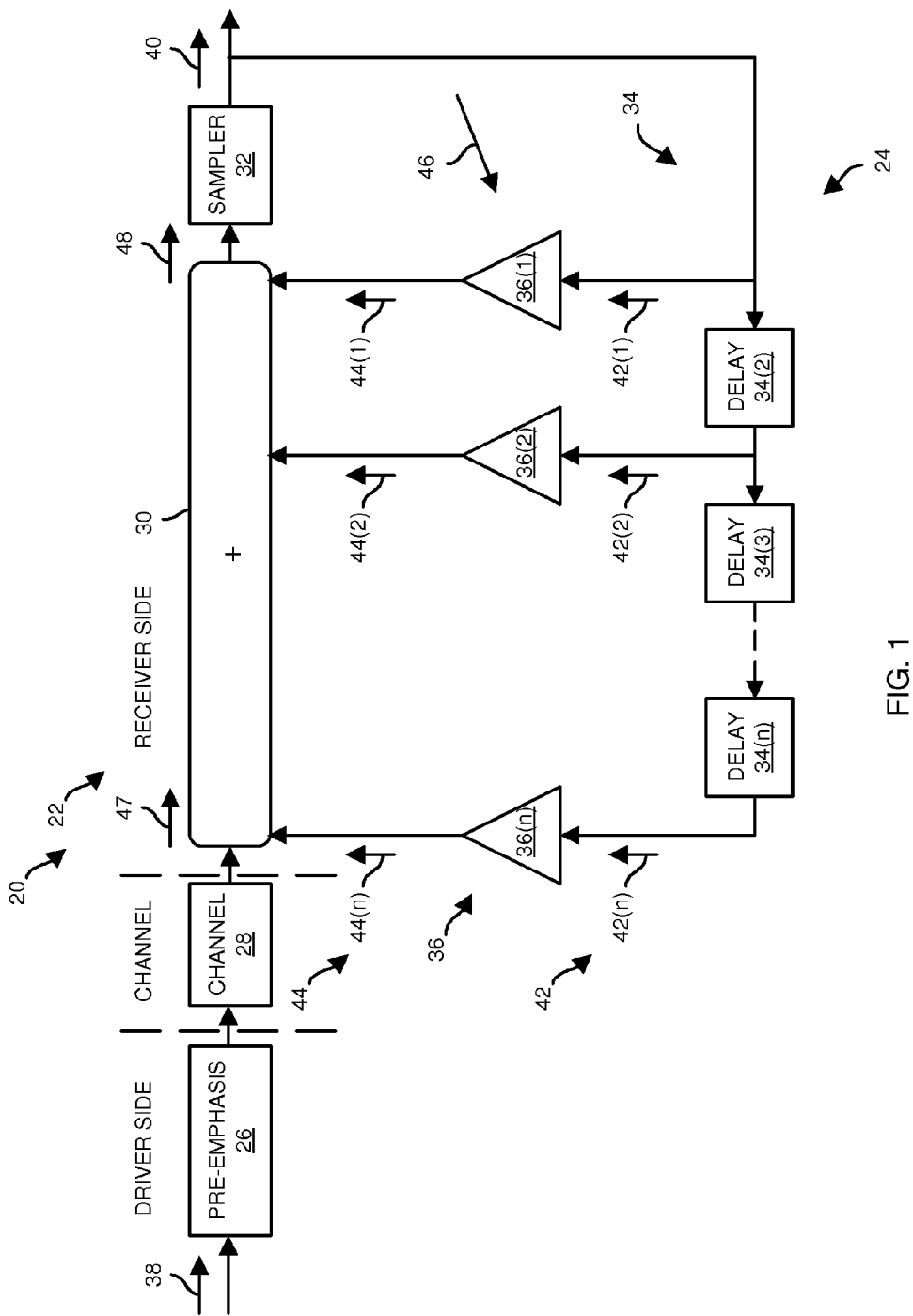
FIG. 1 is a block diagram of a conventional non-linear Decision Feedback Equalizer (DFE) which can be employed by electronic circuits such as SERializer/DESerializer (SERDES) devices.

Embodiments of the invention are directed to techniques for simulating a non-linear Decision Feedback Equalizer (DFE) as a linear filter which can be exclusive of non-linear operations. For example, the non-linear DFE 20 of FIG. 1 is capable of being represented as a simple finite impulse response (FIR) linear filter which can be effectively simulated by standard EDA tools. As a result complete channel performance (e.g., of a SERDES device) can be easily evaluated in time-domain space, frequency-domain space, and parameter space.

Figure 2:
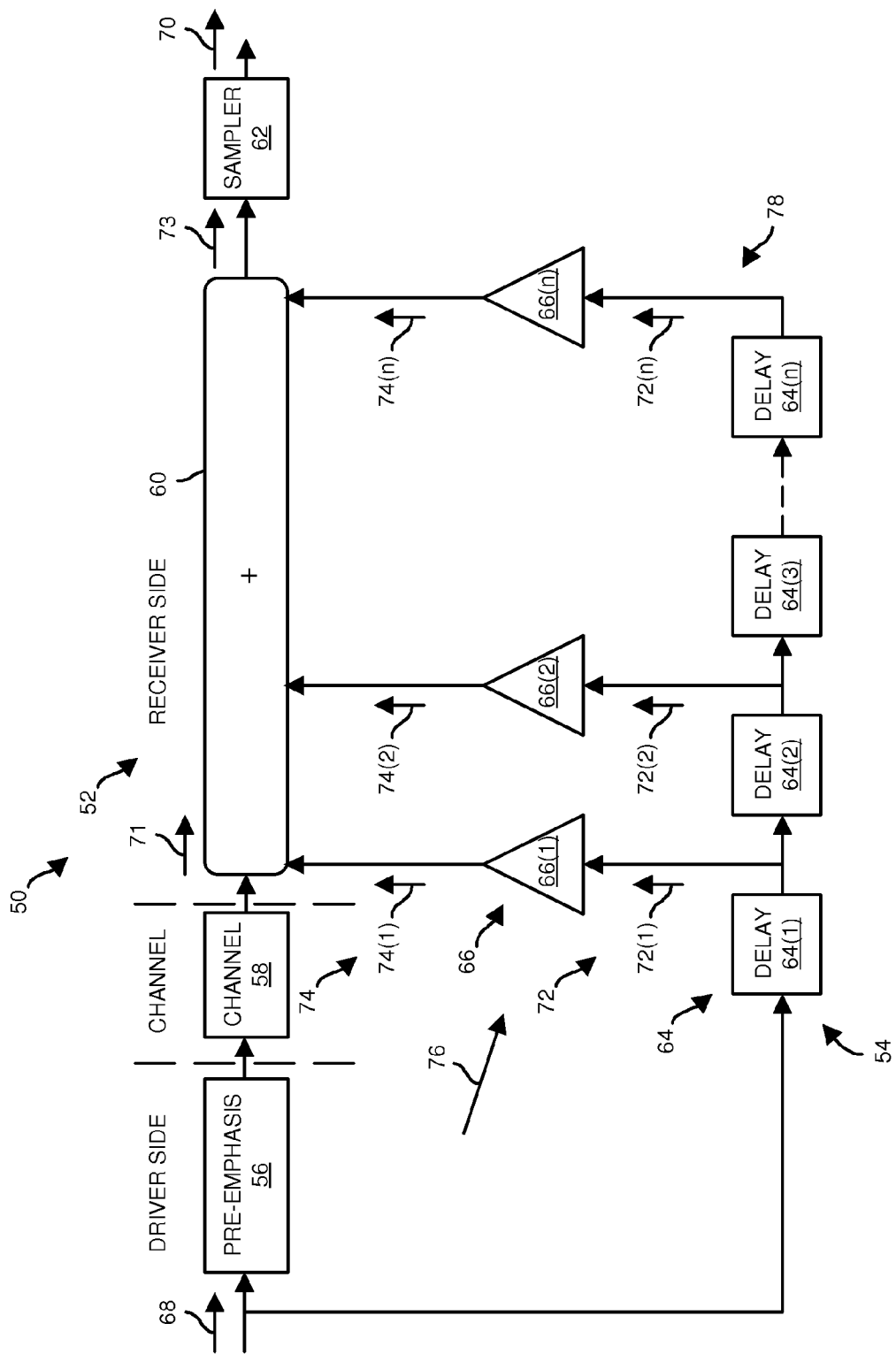
FIG. 2 is a block diagram of a linear filter, a model of which is well-suited for simulation of the DFE of FIG. 1 within an Electronic Design Automation (EDA) tool.

FIG. 2 shows a linear filter 50 which is well-suited for representing a non-linear DFE within an Electronic Design Automation system. That is, in situations involving the need to simulate a DFE such as the DFE 20 of FIG. 1, the EDA system is capable of simulating the DFE using a model of the linear filter 50. The linear filter 50 includes a signal pathway 52 and a finite impulse response (FIR) filter 54. The signal pathway 52 follows a pre-emphasis stage 56 and a channel 58, and resides on the receiver side of a larger electronic circuit. The signal pathway 22 includes summation circuitry 60 and a sampler (or output) 62 which are serially connected. The FIR filter 54 includes a tapped delay line 64 formed by series-connected delay segments (or circuits) 64(1), 64(2), ... 64(n) and associated weight circuits 66(1), 66(2), ... 66(n) (collectively, weight circuits 66).

When modeling the DFE 20 of FIG. 1, the initial delay segment 64(1) provides a time delay which is substantially equal to the time delay provided by the pre-emphasis 26, the channel 28, the summation circuitry 30 and the sampler 32 of FIG. 1. That is, the time delay incurred between the input signal 38 and the output signal 40 is imposed by the initial delay segment 64(1). Accordingly, the linear filter 50 employs characteristics of the non-linear DFE 20 when simulating the non-linear DFE 20. The remaining delay segments 64(2), ... 64(n) are 1-bit timer delay circuits that provide 1-bit delays to the input signal 68.

During operation, the signal pathway 52 of the DFE 50 receives an input signal 68 through both the channel 58 and the FIR filter 54, and provides an output signal 70. In particular, the channel 58 provides a channel signal 71 into the summation circuit 60 which outputs a signal 73 to the sampler block 62. Along these lines, the delay line 64 of the FIR filter 54 receives the input signal 68 and provides a set of time-delayed signals 72(1), 72(2), ... 72(n) (collectively, delayed signals 72) to the associated weight circuits 66. The weight circuits 66 then provide a set of weighted signals 74(1), 74(2), ... 74(n) (collectively, weighted signals 74) to the summation circuitry 60 of the signal pathway 52 in response to (i) the set of time-delayed signals 72 and (ii) a set of decisions 76 (e.g., training from a controller). The summation circuitry 60 receives the input signal 68 and the created time-delayed and weighted signals 72(1), 72(2), ... 72(n) and is thus able to cancel out intersymbol interference and minimize noise enhancement.

Clearly, connections 78 among the channel 58, the FIR filter 54 and the sampler 62 are such that the channel 58 and the FIR filter 54 are ahead of the sampler 62. In particular, the FIR filter 54 is connected in parallel with the pre-emphasis stage 56 and the channel 58 so that the summation circuitry 60 receives both the input signal 68, and delayed and weighted components 74 of the input signal 68 prior to providing the sum of the values to the sampler 62. As a result, the filter 50 is exclusively linear in operation, and efficient to simulate with an EDA system.

It should be understood that an EDA system which simulates a DFE (e.g., the DFE 20 of FIG. 1) using a model of the linear filter 50 of FIG. 2 is more efficient in operation. Such a system relies on an assumption that the sampler 62 always outputs, as the output signal 70, a correct determination of the input signal 68. This assumption is safe to make during simulation. That is, there would be no errors made by the DFE so the DFE can safely be simulated by the linear filter 50.

In contrast, it should be understood that the non-linear nature of a DFE is difficult to handle in a linear simulator. Accordingly, under the safe assumption that the operation of the sampler 62 of the linear filter 50 of FIG. 2 is always correct, modeling of the DFE using a representation of the linear filter 50 is a very efficient technique for simulating a DFE particularly when the simulation involves extremely long bit sequences. Further details will now be provided with reference to FIG. 3.

Figure 3:
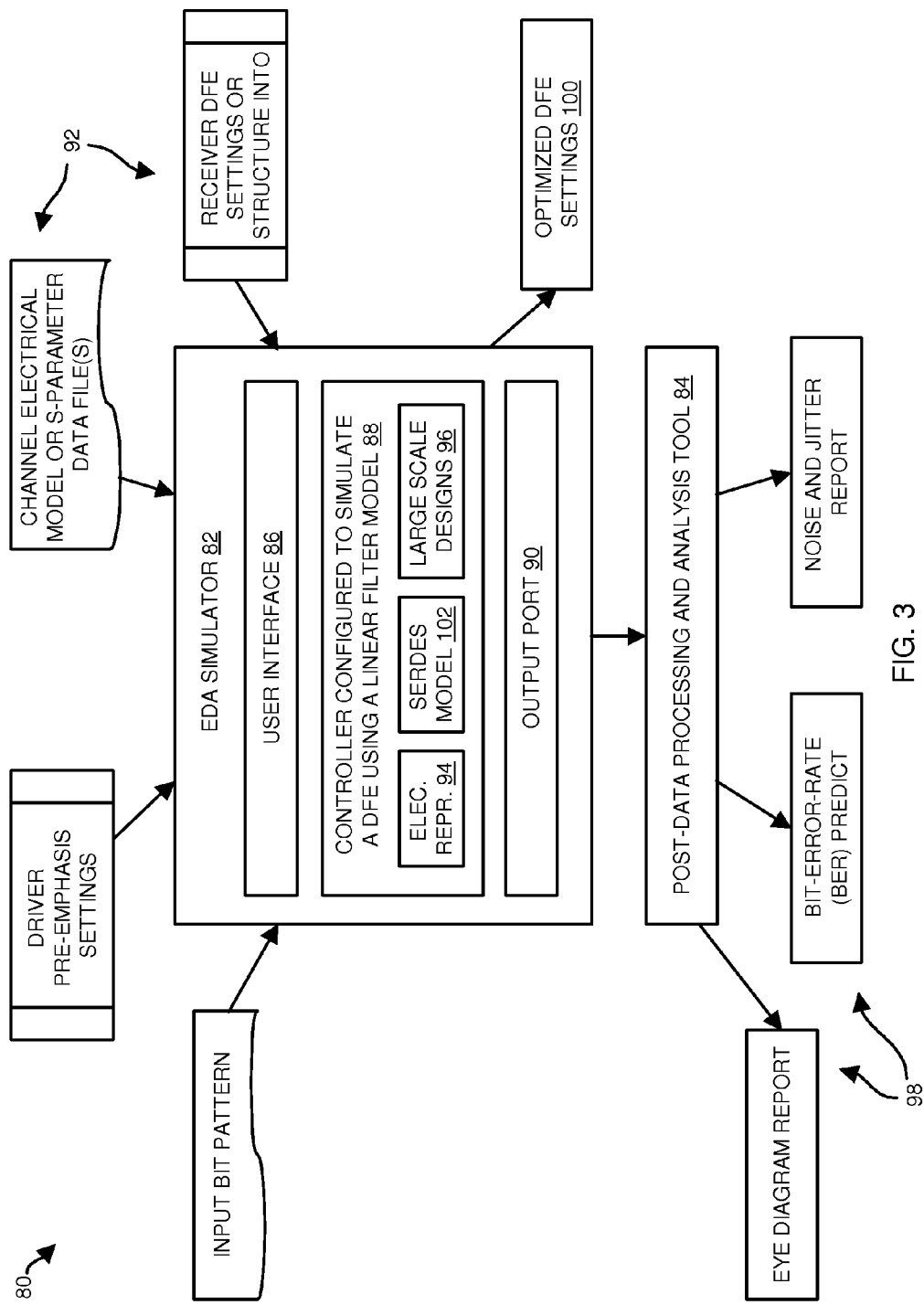
FIG. 3 is an EDA system which is capable of generating, as an electronic model of the non-linear DFE of FIG. 1, an electronic representation of the linear filter of FIG. 2 in response to the electronic design automation commands.

FIG. 3 shows an EDA system 80 which is suitable for simulating a non-linear DFE (e.g., the non-linear DFE 20 of FIG. 1) using a representation of the linear filter 50 of FIG. 2. As shown in FIG. 3, the EDA system 80 includes an EDA simulator 82 and a post-data processing and analysis tool 84. The EDA simulator 82 includes an input device and user interface 86, a controller 88, and an output port 90 which are coupled together. The input device and user interface 86 is configured to receive commands and data 92 from external sources (e.g., users, vendors, etc.), and provide information back to a user. These commands and data 92 are capable of being input into the EDA simulator 82 in a variety of ways such as via data files, keyboard entries, and so on.

The controller 88 is configured to receive these EDA commands and data 92 through the input device and user interface 86, and perform a variety of EDA operations in response to the EDA commands and data 92. For example, the controller 88 is capable of (i) generating, as an electronic model of the non-linear DFE 20, an electronic representation 94 of the linear filter 50 (FIG. 2) in response to certain EDA commands and data 88, and (ii) integrating the electronic representation 94 into an electronic circuit design 96 having other electronic representations of other electronic circuits. The EDA simulation results 98 (e.g., the electronic circuit design 96, a signal quality reports, optimized DFE settings, etc.) are then externally accessible through the output port 90 by the post-data processing and analysis tool 84. In some arrangements, the optimized DFE settings 100 include a subset of the decisions 76 (also see FIG. 2) that provide acceptable or improved simulation results.

During operation, when the EDA system 80 is faced with simulating a DFE such as the DFE 20 (FIG. 1), the EDA system 80 is capable of simulating the DFE 20 using a pseudo-code model. An example of pseudo-code for a filter which is similar to the linear filter 50 of FIG. 2 is as follows.

```
1.   Initialize all state variables
2.   Input bits convolute with channel and pre-emphasis function:
         temp1 = input © pre-emphasis © Channel
3.   Combine the output of DFE FIR filter and temp1
         temp2= temp1+DFE_FIR_FILTER(input)
4.   Decide the output
         Output=Sampler(temp2)
```

In this pseudo-code model, the current bit value (e.g., temp 2 which is output by the summation circuit 60 to the sampler 62) is a based simply on a delayed input. That is, the signal from the channel into the summation circuit (e.g., see the signal 71 in FIG. 2) corresponds to temp 1, and the signal from the summation circuit entering the sampler block (e.g., see the signal 73 in FIG. 2) corresponds to temp 2. The symbol © in the above-provided pseudo-code represents a convolution operation. As shown, the model is exclusive of non-linear operations, and thus is capable of being efficiently processed by the EDA system 20. Such a model nevertheless provides good correlation with a real DFE circuit. Thus, the model is very well-suited for simulating a DFE circuit within a model of a SERDES device 102 (see FIG. 3) which is capable of being a component of the larger electronic circuit design 96.

It should be understood that there could be a variety of ways the controller 88 could be applied within an EDA tool. For example, the controller 88 could be used in pre-layout, post-layout, I/O circuit design and other tasks which involve high speed SERDES circuit with DFE function blocks. Along these lines, suppose that a designer wishes to evaluate the channel bit error rate (BER) at the pre-layout stage with known driver and receiver (with DFE) from silicon vendors. By applying known information to the EDA tool, the EDA tool is capable of getting the optimized driver and receiver settings since the system is simulated in a purely linear manner. These settings are easily computed by the controller 88. Then, with the optimized settings, the channel can be simulated with pre-selected input bit patterns. The eye diagram under different numbers of bits can be plotted and the bit error rate can be accurately predicted. If the channel does not meet design requirements, the designer (e.g., a PCB layout engineer) can change the board layout and provide a new set of channel models for the EDA tool to simulate, process and analyze. By following similar steps, the designer (e.g., a circuit designer) could use such information to evaluate its performance and optimize the design. Further details will now be provided with reference to FIG. 4.

Figure 4:
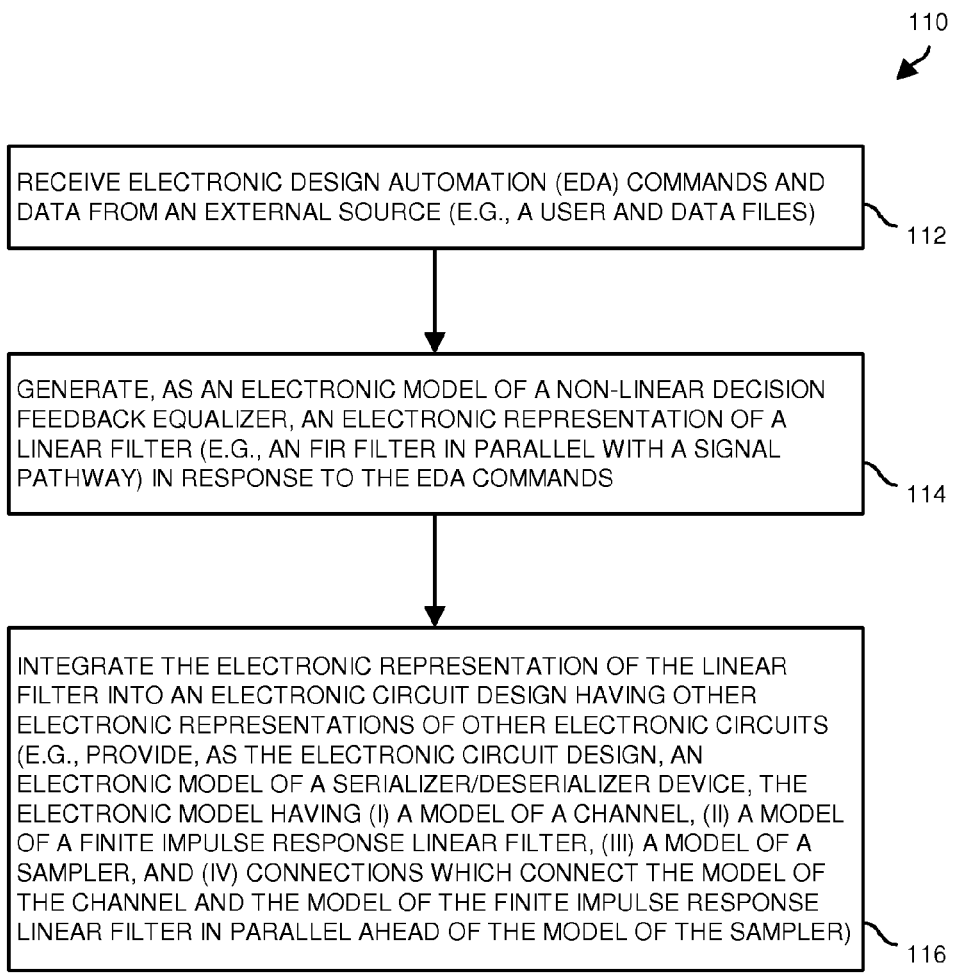
FIG. 4 is a flowchart of a procedure for simulating the non-linear DFE using the model of FIG. 2.

FIG. 4 is a flowchart of a procedure 110 for simulating a non-linear DFE which is performed by the controller 88 of the EDA system 80 of FIG. 3. In step 112, the controller 88 receives electronic design automation commands and data 92 from external sources (e.g., a user, from computerized data files, etc.). Such commands and data 92 may include input bit patterns, driver pre-emphasis settings, channel electrical model or S-parameter data file information, and receiver DFE settings or structure information, among other things.

In step 114, the controller 88 generates, as an electronic model of the non-linear DFE, an electronic representation 94 of a linear filter 50 in response to the EDA commands and data 92. In this step, the controller 88 uses weighted time delay signals 44 based on delayed portions of an input signal 38 which are determined by a set of decisions 76 (also see FIG. 2). A modeled summation circuit combines the input signal 38 with these weighted time delay signals 44 to cancel the intersymbol interference and concurrently minimize noise enhancement.

In step 116, the controller 88 integrates the electronic representation 94 of the linear filter 50 into an electronic circuit design 96 having other electronic representations of other electronic circuits. For example, the controller 88 provides, as the electronic circuit design 96, an electronic circuit design 96 which includes a model 100 of a SERDES device. By way of example, the SERDES model 100 has (i) a model of a channel 58, (ii) a model of a finite impulse response linear filter 54, (iii) a model of a sampler 62, and (iv) connections 78 which connect the model of the channel 58 and the model of the finite impulse response linear filter 54 in parallel ahead of the model of the sampler 62. Such a simulation is straight-forward and efficient to perform without deficiencies of accurately simulating a non-linear DFE.

As mentioned above, embodiments of the invention are directed to techniques for simulating a non-linear DFE as a linear filter which can be exclusive of non-linear operations. For example, the non-linear DFE 20 of FIG. 1 is capable of being represented as a simple finite impulse response (FIR) linear filter 50 which can be effectively simulated by standard EDA tools. As a result, complete channel performance (e.g., of a SERDES device) can be easily evaluated in time-domain space, frequency-domain space, and parameter space.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A computerized system to simulate a non-linear Decision Feedback Equalizer, the computerized system comprising:

a user interface;

an output port; and a controller coupled to the user interface and to the output port, the controller being configured to (i) receive electronic design automation commands from a user through the user interface, (ii) generate, as an electronic model of the non-linear Decision Feedback Equalizer, an electronic representation of a linear filter in response to the electronic design automation commands, and (iii) integrate the electronic representation of the linear filter into an electronic circuit design having other electronic representations of other electronic circuits, the electronic circuit design being externally accessible through the output port;

wherein the controller, when generating, as the electronic model of the non-linear Decision Feedback Equalizer, the electronic representation of the linear filter in response to the electronic design automation commands, is constructed and arranged to:

include, in the electronic model, (i) a set of non-feedback inputs and (ii) a representation of a sampler circuit providing an output signal which is exclusively based on the set of non-feedback inputs, the output signal provided by the sampler circuit being an output of the electronic model;

wherein the controller, when integrating the electronic representation of the linear filter into the electronic circuit design, is configured to:

provide, as the electronic circuit design, an electronic model of a serializer/de-serializer device; and wherein the controller, when providing the electronic model of the serializer/de-serializer device, is configured to:

output (i) a model of a channel, (ii) a model of a finite impulse response linear filter, (iii) a model of a sampler, and (iv) connections which connect the model of the channel and the model of the finite impulse response linear filter in parallel ahead of the model of the sampler.

2. A computerized system as in claim 1 wherein the controller is configured to generate the electronic representation such that the electronic model of the non-linear Decision Feedback Equalizer is exclusive of non-linear operations.

3. A computerized system as in claim 1 wherein the model of the finite impulse response linear filter is configured to (i) create a time delay signal based on an input signal to the model of the channel (ii) provide the time delay signal to the model of the sampler.

4. A computerized system as in claim 1 wherein the output port is configured to output the electronic circuit design to a computerized data analysis process, the electronic circuit design including electronic design automation simulation data for the serializer/de-serializer device.

5. A computerized system as in claim 1 wherein the controller includes electronic circuitry which is constructed and arranged to (i) obtain commands and data from the user through the user interface and (ii) provide responses to the user through the user interface, when the controller receives the electronic design automation commands.

6. A computerized system to simulate a non-linear Decision Feedback Equalizer, the computerized system comprising:

a user interface;
an output port; and
a controller coupled to the user interface and to the output port, the controller including:
means for receiving electronic design automation commands from a user through the user interface,
means for generating, as an electronic model of the non-linear Decision Feedback Equalizer, an electronic representation of a linear filter in response to the electronic design automation commands, and
means for integrating the electronic representation of the linear filter into an electronic circuit design having other electronic representations of other electronic circuits, the electronic circuit design being externally accessible through the output port;
wherein the means for integrating includes:
means for providing, as the electronic circuit design, an electronic model of a serializer/de-serializer device; and
wherein the means for providing includes:
means for outputting (i) a model of a channel, (ii) a model of a finite impulse response linear filter, (iii) a model of a sampler, and (iv) connections which connect the model of the channel and the model of the finite impulse response linear filter in parallel ahead of the model of the sampler.

7. A computerized system as in claim 6 wherein the means for generating is configured to generate the electronic representation such that the electronic model of the non-linear Decision Feedback Equalizer is exclusive of non-linear operations.

8. A computerized system as in claim 6 wherein the model of the finite impulse response linear filter is configured to (i) create a time delay signal based on an input signal to the model of the channel (ii) provide the time delay signal to the model of the sampler.

9. A computerized system as in claim 6 wherein the output port is configured to output the electronic circuit design to a computerized data analysis process, the electronic circuit design including electronic design automation simulation data for the serializer/de-serializer device.

10. A computerized system as in claim 6 wherein the means for generating, as the electronic model of the non-linear Decision Feedback Equalizer, the electronic representation of the linear filter in response to the electronic design automation commands, has:

means for including, in the electronic model, (i) a set of non-feedback inputs and (ii) a representation of a sampler circuit providing an output signal which is exclusively based on the non-feedback inputs, the output signal provided by the sampler circuit being an output of the electronic model.

11. A computerized system as in claim 6 wherein the means for receiving includes electronic circuitry which is constructed and arranged to (i) obtain commands and data from the user through the user interface and (ii) provide responses to the user through the user interface.

12. A computer program product having a non-transitory computer readable medium with instructions stored thereon; the instructions, when run on a computer, being configured to cause the computer to:

receive electronic design automation commands from a user;

generate, as an electronic model of the non-linear Decision Feedback Equalizer, an electronic representation of a linear filter in response to the electronic design automation commands; and integrate the electronic representation of the linear filter into an electronic circuit design having other electronic representations of other electronic circuits;

wherein the computer, when integrating the electronic representation of the linear filter into the electronic circuit design, is configured to provide, as the electronic circuit design, an electronic model of a serializer/de-serializer device; and wherein the computer, when providing the electronic model of the serializer/de-serializer device, is configured to: output (i) a model of a channel, (ii) a model of a finite impulse response linear filter, (iii) a model of a sampler, and (iv) connections which connect the model of the channel and the model of the finite impulse response linear filter in parallel ahead of the model of the sampler.

13. A computerized system as in claim 12 wherein the computer is configured to generate the electronic representation such that the electronic model of the non-linear Decision Feedback Equalizer is exclusive of non-linear operations.

14. A computer program product as in claim 12 wherein the model of the finite impulse response linear filter is configured to (i) create a time delay signal based on an input signal to the model of the channel (ii) provide the time delay signal to the model of the sampler.

15. A computer program product as in claim 12 wherein the computer is configured to output the electronic circuit design to a computerized data analysis process, the electronic circuit design including electronic design automation simulation data for the serializer/de-serializer device.

16. A computer program product as in claim 12 wherein the instructions which are configured to cause the computer to generate, as the electronic model of the non-linear Decision Feedback Equalizer, the electronic representation of the linear filter in response to the electronic design automation commands, include:
  a set of non-feedback inputs, and
  a representation of a sampler circuit providing an output signal which is exclusively based on the non-feedback inputs, the output signal provided by the sampler circuit being an output of the electronic model.

17. A computer program product as in claim 12 wherein the computer, when receiving the electronic design automation commands from the user; is configured to utilize electronic circuitry of the computer to (i) obtain commands and data from the user through a user interface and (ii) provide responses to the user through the user interface.

18. In an electronic apparatus constructed and arranged to operate as an electronic design automation (EDA) tool which is constructed and arranged to perform simulation, a method for simulating a non-linear Decision Feedback Equalizer, the method comprising:
  receiving electronic design automation commands from a user;
  generating, as an electronic model of the non-linear Decision Feedback Equalizer, an electronic representation of a linear filter in response to the electronic design automation commands; and
  integrating, within the EDA tool, the electronic representation of the linear filter into an electronic circuit design having other electronic representations of other electronic circuits;
  wherein generating, as the electronic model of the non-linear Decision Feedback Equalizer, the electronic representation of the linear filter in response to the electronic design automation commands involves:
    including, in the electronic model, (i) a set of non-feedback inputs and (ii) a representation of a sampler circuit providing an output signal which is exclusively based on the set of non-feedback inputs, the output signal provided by the sampler circuit being an output of the electronic model; and
  wherein integrating the electronic representation of the linear filter into the electronic circuit design includes:
    providing, as the electronic circuit design, the electronic model of a serializer/de-serializer device, the electronic model of the serializer/de-serializer device having (i) a model of a channel, (ii) a model of a finite impulse response linear filter, (iii) a model of a sampler, and (iv) connections which connect the model of the channel and the model of the finite impulse response linear filter in parallel ahead of the model of the sampler.

19. A method as in claim 18 wherein receiving the electronic design automation commands from the user includes utilizing electronic circuitry of the electronic apparatus to (i) obtain commands and data from the user through a user interface of the electronic apparatus and (ii) provide responses to the user through the user interface of the electronic apparatus.

* * * * *